United States Patent [19]
Tran

[11] Patent Number: 6,082,296
[45] Date of Patent: Jul. 4, 2000

[54] THIN FILM DEPOSITION CHAMBER

[75] Inventor: Chuong Van Tran, Redondo Beach, Calif.

[73] Assignee: Xerox Corporation, Stamford, Calif.

[21] Appl. No.: 09/400,933

[22] Filed: Sep. 22, 1999

[51] Int. Cl.[7] .......................... C23C 16/448; C23C 16/00
[52] U.S. Cl. ............................ 118/723 EB; 204/298.27; 118/723 VE
[58] Field of Search ..................... 118/726, 727, 118/723 VE, 723 EB, 723 CB, 730; 204/298.27, 298.28

[56] References Cited

U.S. PATENT DOCUMENTS

| | | | |
|---|---|---|---|
| 3,598,083 | 8/1971 | Dort et al. | 118/723 EB |
| 3,799,110 | 3/1974 | Bellman | 204/298.27 |
| 3,889,632 | 6/1975 | Brunner et al. | 118/723 CB |
| 4,010,710 | 3/1977 | Williams | 118/723 EB |
| 4,380,212 | 4/1983 | Kraus | 118/726 |
| 4,823,735 | 4/1989 | Pichel et al. | 118/730 |
| 4,858,556 | 8/1989 | Siebert | 118/726 |
| 5,190,590 | 3/1993 | Suzuki et al. | 118/727 |
| 5,262,194 | 11/1993 | Bischer, Jr. et al. | 118/727 |
| 5,478,398 | 12/1995 | Nakanishi et al. | 118/726 |
| 5,741,404 | 4/1998 | Cathey | 204/298.27 |

*Primary Examiner*—Jeffrie R Lund
*Assistant Examiner*—Sylvia R. MacArthur
*Attorney, Agent, or Firm*—Fariba Rad

[57] ABSTRACT

A thin film deposition chamber utilizes a planetary fixture and two vapor sources to generate two partially overlapping vapor streams. The two vapor streams create a combined distribution profile. The planetary fixture holds a plurality of substrates in a position similar to a portion of the combined distribution profile.

18 Claims, 6 Drawing Sheets

THIN FILM DEPOSITION CHAMBER

BACKGROUND OF THE INVENTION

This invention relates to deposition of thin film organic material on electronic displayes and more particularly to design of a deposition chamber which increases precision of final thickness and thickness uniformity of the thin film deposition.

Typically, a thin layer (thin film) of organic material is placed on electronic displays for different purposes. One such purpose is to provide a correct amount of brightness which is dependent on the thickness of the thin film. When a fixed voltage is applied to the thin film, depending on the thickness of the thin film, different brightness will be resulted. Therefore, for fabricating electronic displays with identical brightness, the thickness of different displays have to be identical and the voltage applied to each display has to be the same. The thickness and the uniformity of the thickness are not only essential for achieving the correct brightness but also are essential for other purposes of using a thin film.

To ensure good film quality, many process parameters have to be controlled. These include the cleanliness of the substrate, incidence angle of the evaporant, and heating the substrate to the required temperature for vapor attraction. However, the most critical factors of thin film production process are controlling the uniformity of layer thickness over the whole surface of the substrate and controlling the final thickness of the film.

Referring to FIG. 1, there is shown a prior art system of depositing a thin film of an organic material on an electronic display. Typically, the deposition process is performed in a vapor chamber 10. Vapor chamber 10 contains two vapor sources 12 and 12'. During the vapor deposition process, only one of the sources is active. For example, in FIG. 1, only vapor source 12 is active. Each vapor source 12 and 12' has a concave surface to hold the organic material 14 and 14', such as Tris (8-hyroxy) quinoline aluminum ($Alq_3$), and an electrical circuitry to heat the organic material to a temperature in the range of 200–240 Celsius. Once the organic material 14 or 14' is heated, it starts vaporizing and creating a vapor stream 16 or 16' respectively. During the vapor deposition, vapor chamber 10 is sealed in order to reduce the pressure of the chamber by a vacuum (not shown). By reducing inside pressure of chamber 10, the vapor stream 16 or 16' raises in an even stream while creating a cosine distribution profile.

In operation, several electronic display substrates 20, such as glass silicon or ceramic substrates, are placed in the path of the vapor stream 16 or 16'. The curved distribution profile of the vapor streams 16 or 16' causes the vapor stream to deposit a non-uniform film on the display substrates 20.

The vapor chamber 10 has a crystal sensor 22 which is located at the same level and receives vapor deposit in the same manner as the display substrates 20. Sensor 22 sends out an output signal and the signal changes as the sensor receives more vapor deposit. The variation of the output signal of the sensor 22 during one run, from the start of a deposition process to the end of the process, indicates a representative value for the thickness of the vapor deposition on the display substrates during the same deposition process.

The output signal of the sensor 22 does not indicate the variation of the deposition thickness on different substrates and the variation of the deposition from one run to the next. In addition, the reason for having only one active vapor source during each deposition process is that sensor 22 is not capable of measuring variation between the vapor distributions of the two vapor sources 12 and 12'.

It is an object of this invention to provide an apparatus which is capable of substantially increasing the degree of uniformity of the thin film deposition and controlling the thickness of the thin film.

SUMMARY OF THE INVENTION

In accordance with the present invention, a thin film deposition chamber utilizes a vapor means to generate a traveling vapor stream with a vapor distribution profile. The deposition chamber also utilizes means for holding a plurality of substrates on the traveling path of the vapor stream. The holding means is constructed and arranged to hold the plurality of substrates at a position substantially similar to a portion of the distribution profile of said vapor stream.

In accordance with another aspect of this invention, a thin film deposition chamber utilizes a plurality of vapor means to generate a plurality of partially overlapping vapor streams. Each vapor stream has a distribution profile. The plurality of overlapping streams create a combined distribution profile which travels on a path. The deposition chamber also utilizes means for holding a plurality of substrates on the traveling path of the combined distribution profile. The holding means is constructed and arranged to hold the plurality of substrates at a position substantially similar to a portion of the combined distribution profile of the vapor streams.

DESCRIPTION OF THE PREFERRED EMBODIMENT

Figure 1:
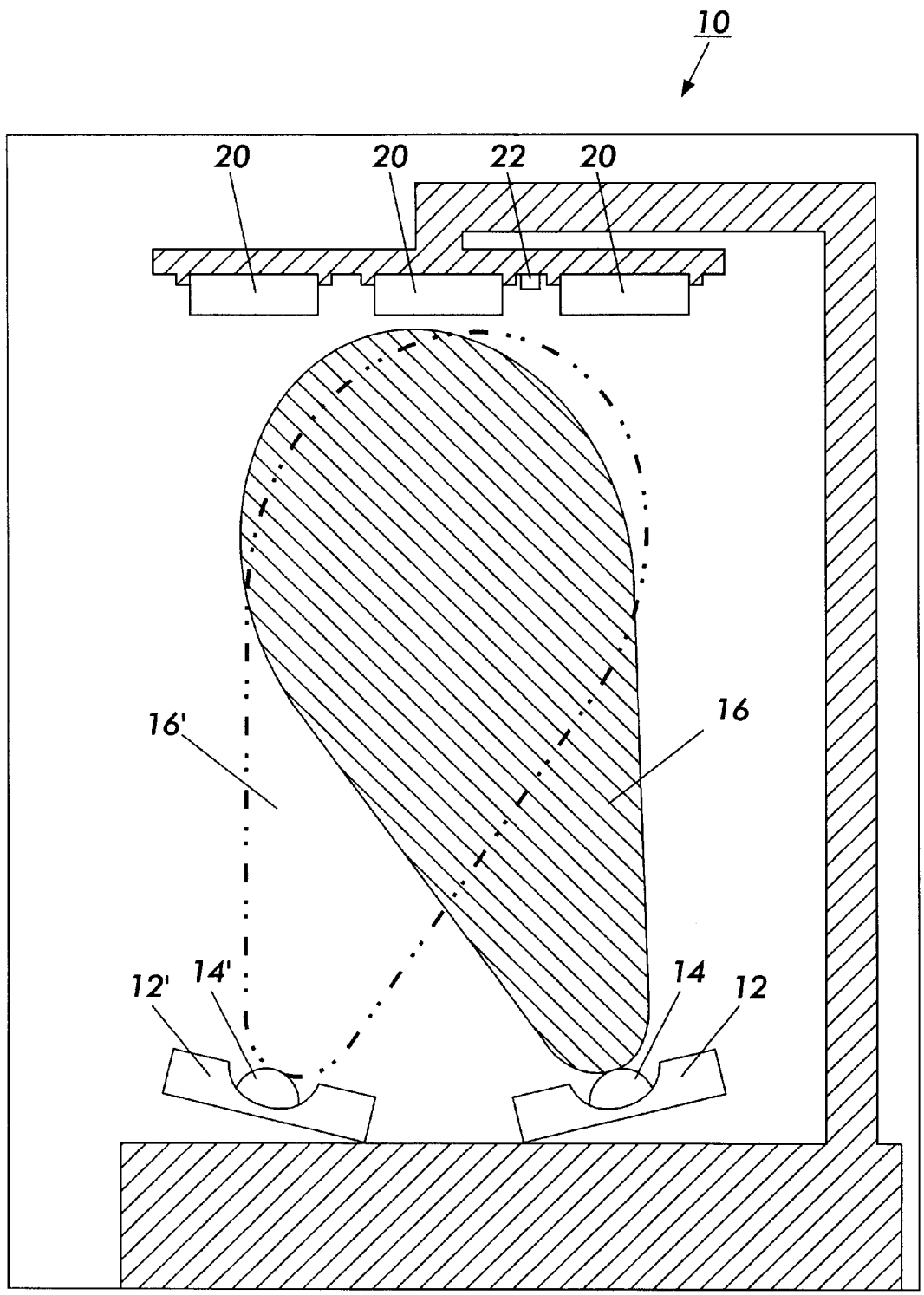
FIG. 1 shows a prior art vapor deposition chamber.
Figure 2:
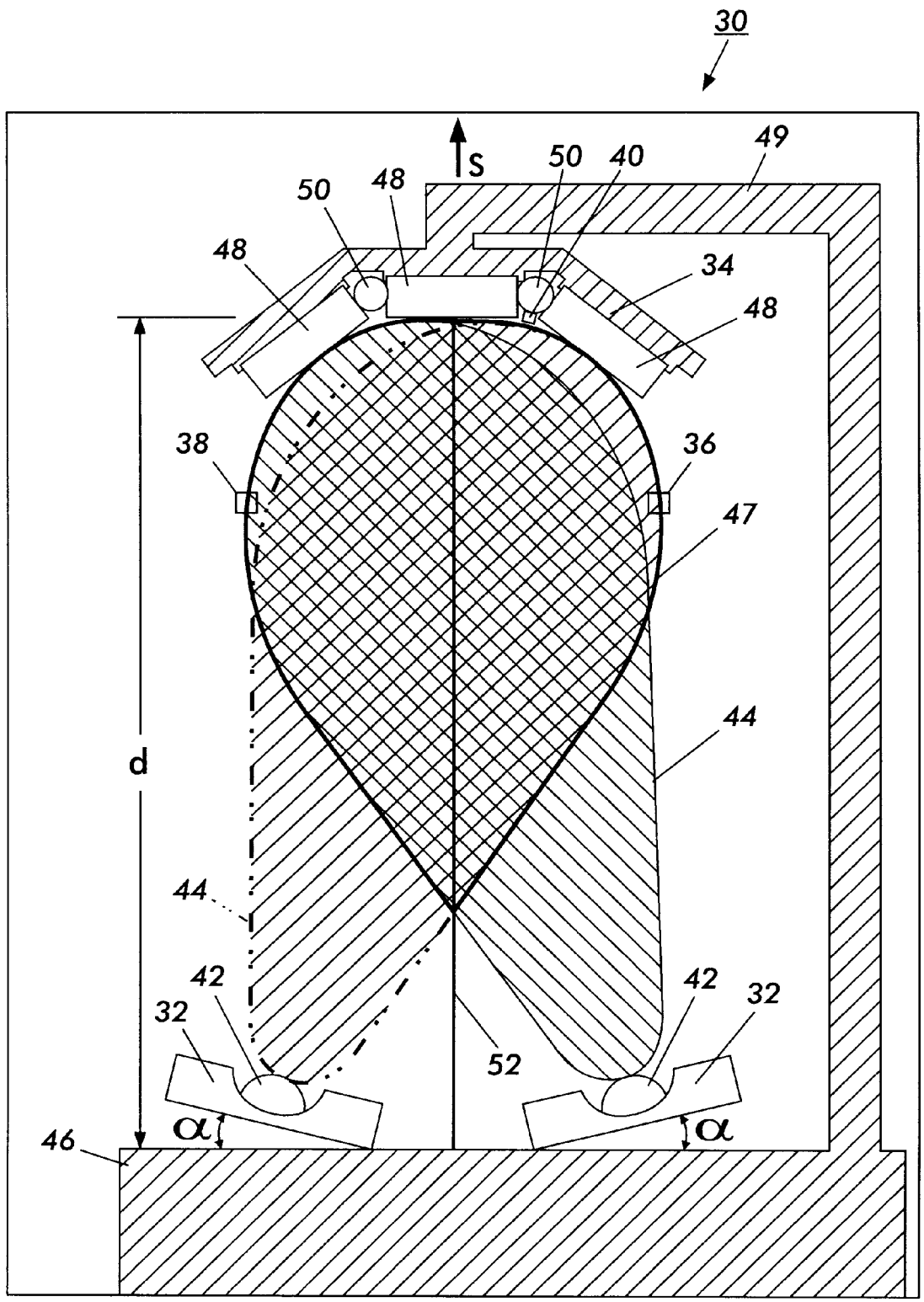
FIG. 2 shows a vapor deposition chamber of this invention.

Referring to FIG. 2, there is shown a vapor chamber 30 of this invention. Vapor chamber 30 comprises two vapor sources 32, a planetary fixture 34 and three vapor distribution monitoring sensors 36, 38, and 40. For the purpose of simplicity hereinafter, "planetary fixture" is referred to as "fixture" and "vapor distribution monitoring sensors" are referred to as "sensors".

Each vapor source 32 has a concave surface to hold the organic material 42. In addition, each vapor source 32 has an electronic circuitry (not shown) that once activated will generate heat and causes the organic material 42 to vaporize and generate a vapor stream 44. The vapor stream 44 from each vapor source has a cosine distribution profile. Each vapor source 32 is mounted on base 46 and positioned to have an angle a with respect to the base 46 to allow the vapor distribution of the two vapor streams 44 to partially overlap each other and generate a combined distribution profile 47. The angle a of each vapor source 32 is individually adjustable to maximize the area covered by the combined distribution profile 47.

It should be noted that the boundaries of the distribution profiles of the vapor streams are not defined as accurately as shown in the drawings. The vapor streams 44 gradually become less dense and fade away. However, the boundaries shown in FIG. 2, show the effective distribution which has sufficient vapor density to be deposited on the display substrates 48.

A supporting frame 49, which is fixed to the base 46, holds the rotating planetary fire 34 on the traveling path S of the combined distribution profile 47 and at distance d from the base 46. The rotating fixture 34 is designed to hold the display substrates 48 in a curved position similar to the curve of a portion of the combined distribution profile 47 to maximize the uniformity of the vapor deposition. The rotating fixture 34 is adjustable through the joints 50 to allow the position of the display substrates 48 to be adjusted with respect to the combined distribution profile 47.

The planetary fixture 34 provides a housing for the display substrates 48 where each substrate 48 is positioned to receive a similar amount of vapor deposit. Also, the planetary fixture 34 rotates about an axis 52 which is substantially perpendicular to the base 46.

During the deposition of the thin film on the display substrates 48, the planetary fixture 34 rotates. The greater the number of revolution during the deposition process makes the thickness deposited per revolution a very small portion of the total thickness of thin film. By selecting a correct distance d between the fixture 34 and the base 46, joint 50 adjustment, source angle α, and the number of revolutions per minute, the thickness non-uniformity can be substantially improved.

For the optimum thickness uniformity, the adjustment of the source angle α, the adjustment of the fixture 34, and the number of rotations of the fixture 34 have to be experimentally calibrated in the first few runs. Once the optimum calibration is achieved, the position of the fixture 34 and the sources 32 will be locked in and the number of rotations of the fixture 34 will be fixed to ensure a highly accurate deposition process time after time.

Figure 3:
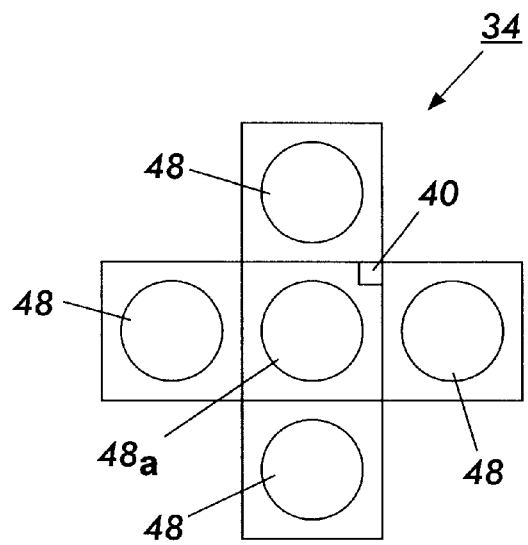
FIG. 3 shows the top view of the planetary fixture of FIG. 2 with the placement of the one of the monitoring sensors next to the substrates.
Figure 4:
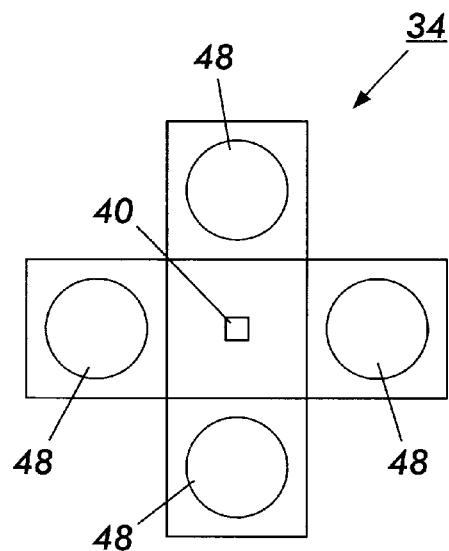
FIG. 4 shows the top view of the planetary fixture of FIG. 2 with an alternative placement of the monitoring sensor next to the substrates.

In the vapor chamber 30, three crystal sensors 36, 38, and 40 are placed to monitor the vapor distributions. Sensors 36 and 38 are placed on the sides of the vapor distributions and the sensor 40 is placed in between the display substrates. Referring to FIGS. 3 and 4, there are shown top views of the fixture 34 with two different placement of the sensor 40. In FIG. 3, sensor 40 is placed next to the center substrate 48a. In FIG. 4, the center substrate 48a of FIG. 3 is removed and sensor 40 is placed at the center. It should be noted that sensor 40 can be placed anywhere on fixture 34 or at the vicinity of the fixture 34.

Figure 5:
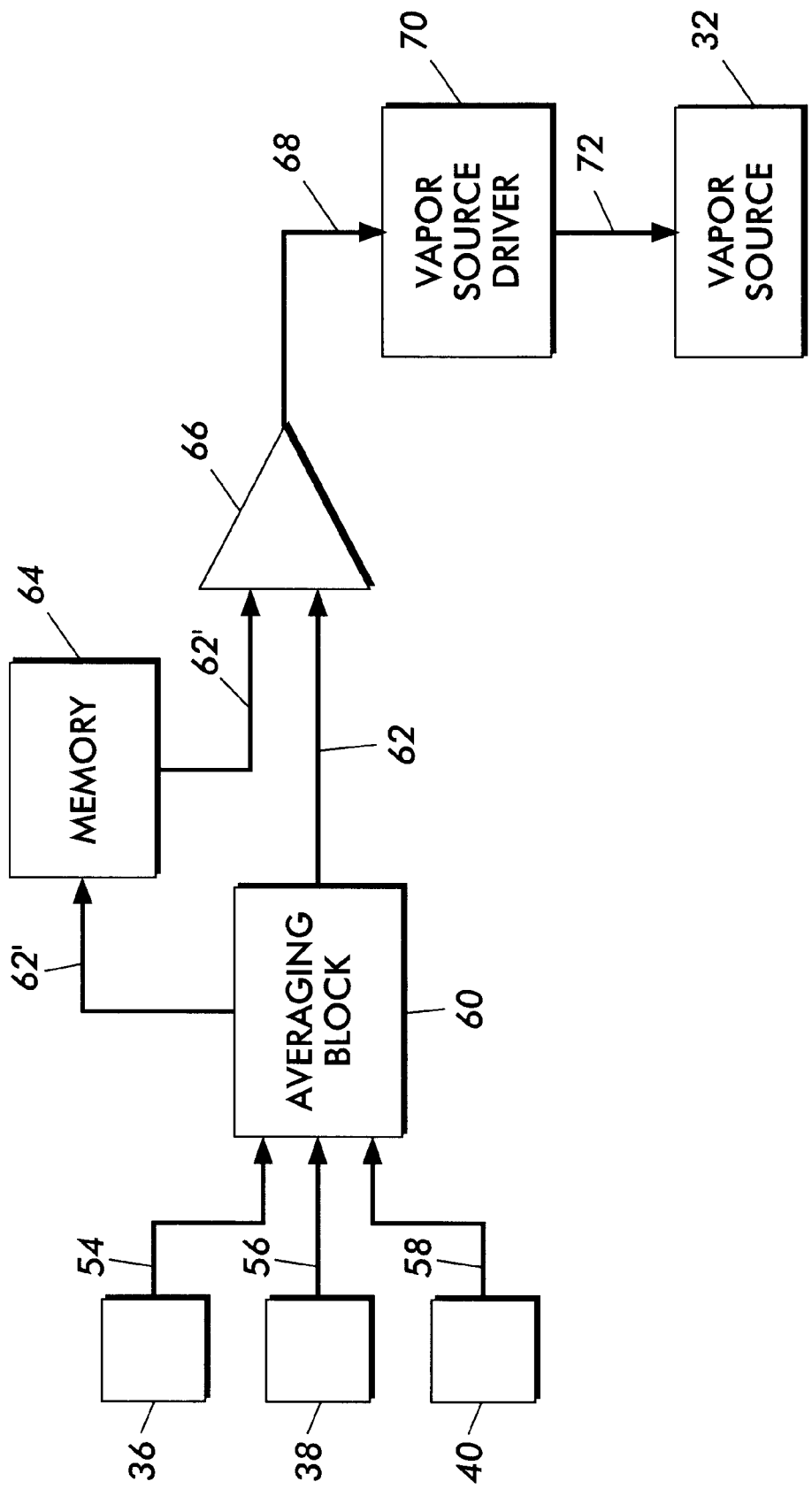
FIG. 5 shows a block diagram of the feedback system of the crystal sensors of FIG. 2 in relation to the driver system of the vapor sources of FIG. 2.

Referring back to FIG. 2, utilizing three sensors 36, 38, and 40 provides a better mechanism to monitor the vapor distributions 44. Referring to FIG. 5, there is shown a block diagram of the feedback system of the crystal sensors 36, 38, and 40 in relation to the driver system of the vapor sources 32. Each one of the crystal sensors 36, 38 and 40 sends out an output signal 54, 56, and 58 respectively based on the amount of the received deposits. The output signals 54, 56, and 58 are sent to an averaging block 60. The averaging block 60 adds the output signals 54, 56, and 58, divides them by 3, and sends out an averaged signal 62. Once the system is calibrated, the overlapping vapor distributions are at their optimum distribution profiles. After calibration, the optimum averaged output signal 62' is stored in a memory 64.

Referring to both FIGS. 2 and 5, since the vapor streams 44 (FIG. 2) are generated through heating organic materials 42, the vapor distribution might change for different runs as the organic material 42 melts or its shape or volume changes. Both the averaged output signal 62 and the optimum averaged output signal 62' (from memory 64) are sent to a comparator 66. In each run, comparator 66 compares averaged output signal 62 to the optimum value 62'. If the averaged output signal 62 is different than the optimum value 62', then the comparator 66 sends out an adjusting signal 68 to the vapor source driver 70 of the vapor sources 32.

Once the amount of organic material 42 in the vapor sources 32 wears down, the averaged output signal 62 will fall below the optimum value 62'. However, if the organic material in the vapor sources are replaced, and they are more than the amount that generated the original amount, then the averaged output signal 62 will be above the optimum value 62'. Depending on if the averaged output signal 62 is above or below the optimum value 62', the vapor source driver 70 decreases or increases the current 72 of the vapor sources 32 respectively until the vapor distribution returns to its optimum distribution.

The deposition chamber 30 of FIG. 2 provides a mechanism to substantially increase the uniformity of the thickness of and control over the final thickness a thin film deposition process.

It is possible to have a deposition chamber of this invention with different numbers of sensors or vapor sources. Furthermore, if one desires, the planetary fixtures 34 of FIG. 2 can be designed to be a fixed (non-rotating) fixture.

Figure 6:
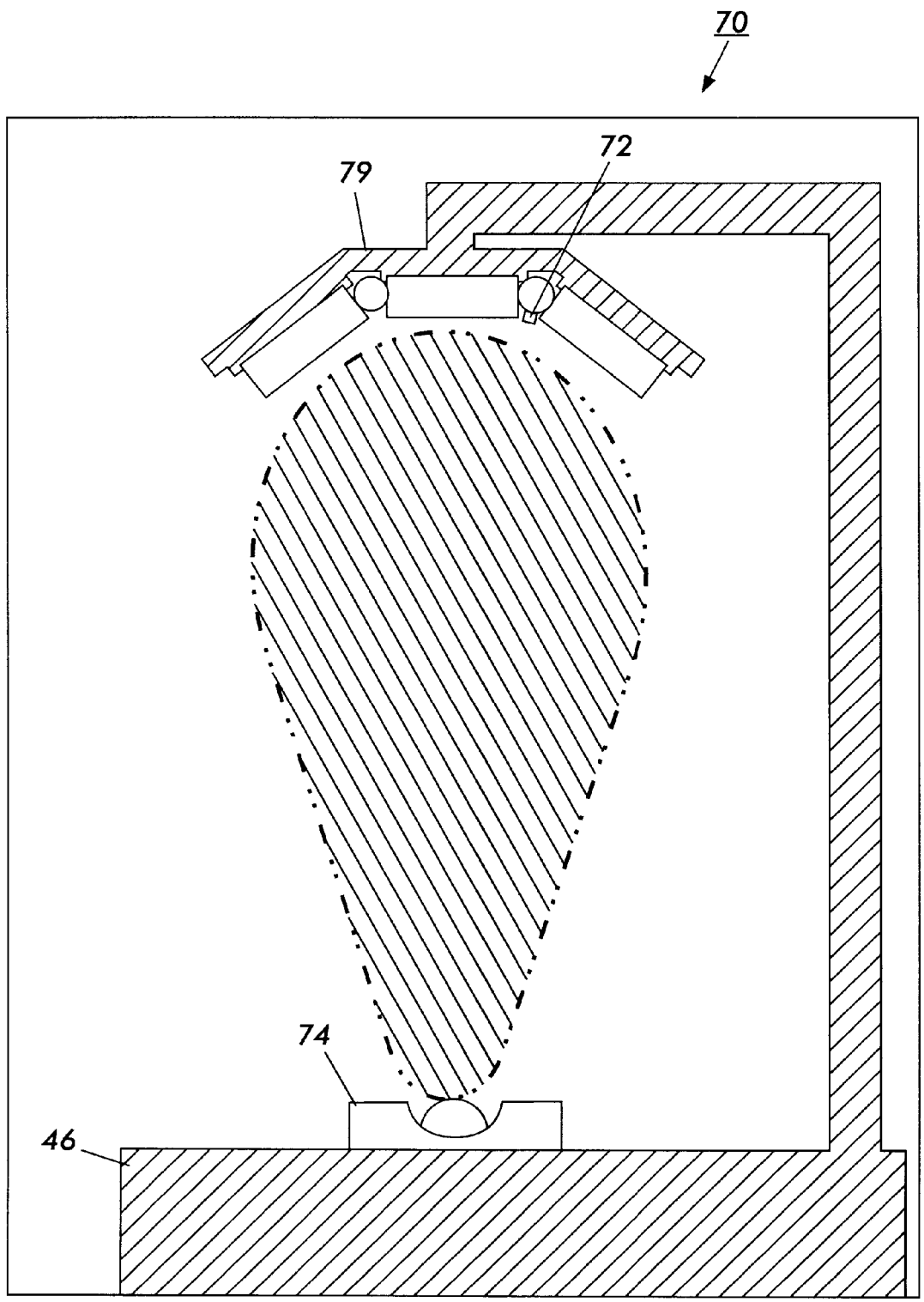
FIG. 6 shows an alternative deposition chamber of this invention.
Figure 7:
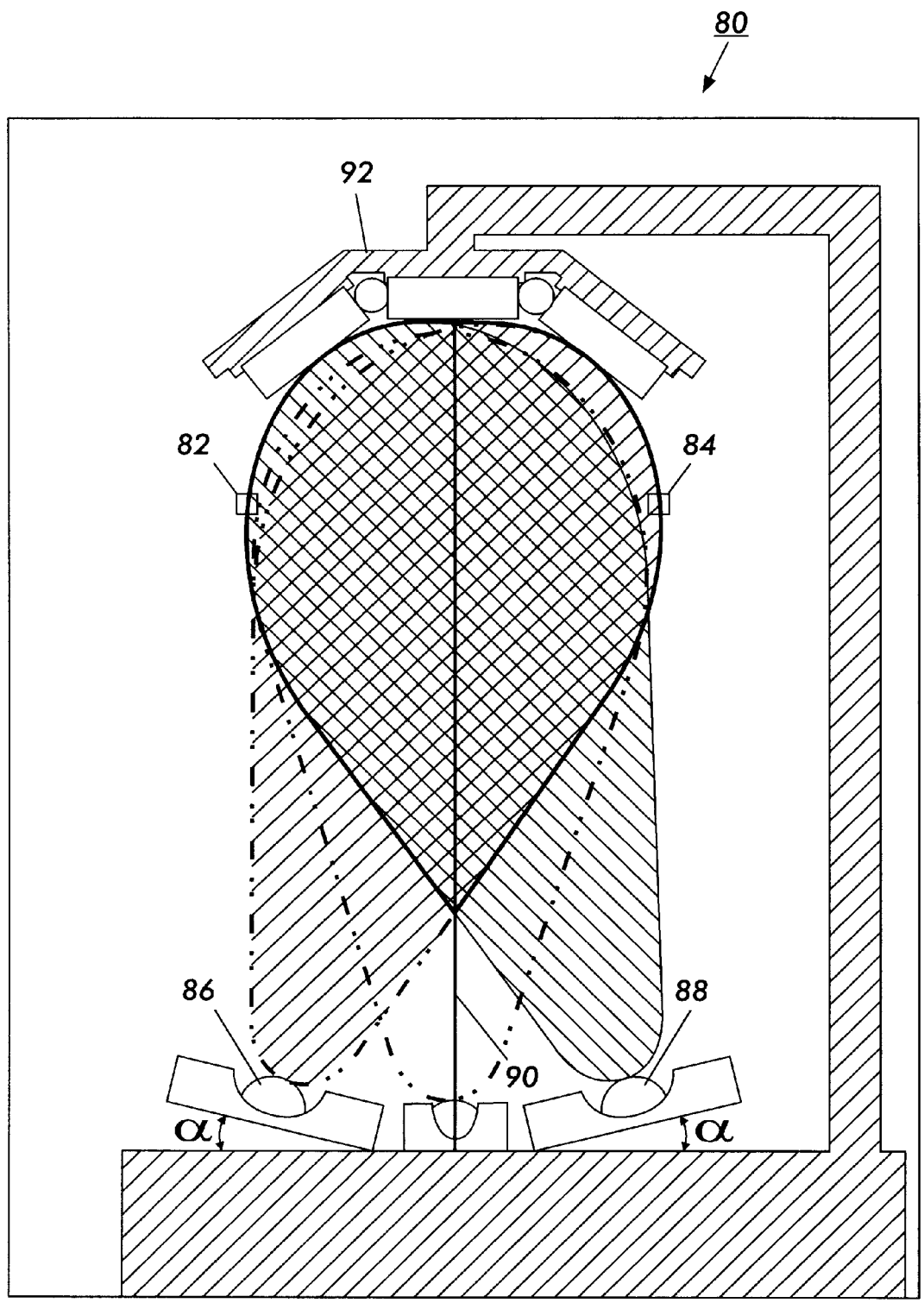
FIG. 7 shows yet another alternative deposition chamber of this invention.

Referring to FIGS. 6 and 7, there are shown two examples of numerous alternatives of a deposition chambers of this invention. In chamber 70 of FIG. 6 only one sensor 72 and only one vapor source 74 is utilized.

In contrast, chamber 80 of FIG. 7 utilizes two sensors 82 and 84 and three vapor sources 86, 88, and 90. Vapor sources 86, 88, and 90 are utilized to generate a plurality of partially overlapping vapor streams to create a combined distribution profile with a higher vapor density.

The disclosed embodiment of FIG. 2 is the preferred embodiment of this invention and provides an optimum result. Reducing the number of sensors and the vapor sources will reduce the optimum performance of the deposition chamber. However, the planetary fixtures 34, 76, and 92 of FIGS. 2, 6 and 7 provide an improved chamber over the conventional deposition chamber.

It should be noted that in this specification, the deposition process is described in relation to organic material thin film on electronic display substrates. However, chamber 30 of FIG. 2 can be utilized for depositing a thin film of any type of material on any type of substrate.

It should also be noted that numerous changes in details of construction and the combination and arrangement of elements may be resorted to without departing from the true spirit and scope of the invention as hereinafter claimed.

What is claimed is:

1. A thin film deposition chamber comprising:
   a vapor means generating a vapor stream traveling on a path;
   said vapor stream having a distribution profile;
   an adjustable means for holding a plurality of substrates on the path of said vapor stream; and said holding means being so constructed and arranged to be adjusted to hold said plurality of substrates at a position substantially similar to a portion of the distribution profile of said vapor stream.

2. The thin film deposition chamber recited in claim 1, wherein said holding means is a rotating fixture.

3. The thin film deposition chamber recited in claim 2, wherein said holding means has at lease one joint for adjusting the position of said plurality of substrates.

4. The thin film deposition chamber recited in claim 2, wherein said chamber has at least one vapor distribution monitoring sensor.

5. The thin film deposition chamber recited in claim 2, wherein said chamber has two vapor distribution monitoring sensors.

6. The thin film deposition chamber recited in claim 2, wherein said chamber has three vapor distribution monitoring sensors.

7. The thin film deposition chamber recited in claim 1, wherein said deposition chamber has a base.

8. The thin film deposition chamber recited in claim 7, wherein said holding means is mounted to said base.

9. The thin film deposition chamber recited in claim 7, wherein said vapor means is adjustably mounted to said base to adjust the position of said vapor means and said vapor stream.

10. A thin film deposition chamber comprising:

a plurality of vapor means for generating a plurality of partially overlapping vapor streams;

each one of said plurality of vapor streams having a distribution profile;

said plurality of overlapping streams creating a combined distribution profile traveling on a path;

an adjustable means for holding a plurality of substrates on the traveling path of said combined distribution profile; and said holding means being so constructed and arranged to be adjusted to hold said plurality of substrates at a position substantially similar to a portion of the combined distribution profile of said plurality of vapor streams.

11. The thin film deposition chamber recited in claim 10, wherein said holding means is a rotating fixture.

12. The thin film deposition chamber recited in claim 11, wherein said holding means has at lease one joint for adjusting the position of said plurality of substrates.

13. The thin film deposition chamber recited in claim 11, wherein said chamber has at least one vapor distribution monitoring sensor.

14. The thin film deposition chamber recited in claim 11, wherein said chamber has two vapor distribution monitoring sensors.

15. The thin film deposition chamber recited in claim 11, wherein said chamber has three vapor distribution monitoring sensors.

16. The thin film deposition chamber recited in claim 10, wherein said deposition chamber has a base.

17. The thin film deposition chamber recited in claim 16, wherein said holding means is mounted to said base.

18. The thin film deposition chamber recited in claim 16, wherein said plurality of vapor means each is adjustably mounted to said base to individually adjust the position of each one of said plurality of vapor means and said overlapping vapor streams.

* * * * *